United States Patent
Hsiao et al.

(10) Patent No.: US 12,119,425 B2
(45) Date of Patent: Oct. 15, 2024

(54) MULTI-JUNCTION LIGHT-EMITTING DIODE AND METHOD FOR MAKING THE SAME

(71) Applicant: TIANJIN SANAN OPTOELECTRONICS CO., LTD., Tianjin (CN)

(72) Inventors: Chihhung Hsiao, Tianjin (CN); Yu-Ren Peng, Tianjin (CN); Kunhuang Cai, Tianjin (CN); Duxiang Wang, Tianjin (CN); Chia-Hung Chang, Fujian (CN)

(73) Assignee: TIANJIN SANAN OPTOELECTRONICS CO., LTD., Tianjin. (CN)

( * ) Notice: Subject to any disclaimer, the term of this patent is extended or adjusted under 35 U.S.C. 154(b) by 420 days.

(21) Appl. No.: 17/655,097

(22) Filed: Mar. 16, 2022

(65) Prior Publication Data
US 2022/0209049 A1    Jun. 30, 2022

Related U.S. Application Data

(63) Continuation-in-part of application No. PCT/CN2020/075867, filed on Feb. 19, 2020.

(51) Int. Cl.
*H01L 33/00* (2010.01)
*H01L 33/02* (2010.01)
*H01L 33/06* (2010.01)
*H01L 33/08* (2010.01)

(52) U.S. Cl.
CPC .......... *H01L 33/08* (2013.01); *H01L 33/0075* (2013.01); *H01L 33/025* (2013.01); *H01L 33/06* (2013.01); *H01L 33/0093* (2020.05)

(58) Field of Classification Search
CPC ... H01L 33/08; H01L 33/0075; H01L 33/025; H01L 33/06; H01L 33/0093; H01L 33/30; H01L 33/305
USPC ...................................................... 257/98, 99
See application file for complete search history.

(56) References Cited

U.S. PATENT DOCUMENTS

7,368,759 B2 * 5/2008 Arai .................. H01L 33/14
                                                    257/101
11,527,667 B2 * 12/2022 Jain .................. H01L 31/0687

FOREIGN PATENT DOCUMENTS

CN         108933186 A       12/2018

* cited by examiner

*Primary Examiner* — Tan N Tran
(74) *Attorney, Agent, or Firm* — Muncy, Geissler, Olds & Lowe, P.C.

(57) ABSTRACT

A multi-junction light-emitting diode (LED) includes a first epitaxial structure, a second epitaxial structure and a tunnel junction structure disposed therebetween. The tunnel junction structure includes a $In_zAl_{X1}Ga_{1-X1}As$ highly doped p-type semiconductor layer wherein z ranges from 0 to 0.05, a $Al_{X2}Ga_{1-X2}As$ first composition graded layer wherein X2 is greater than 0 and less than X1, a $Ga_yIn_{1-y}P$ highly doped n-type semiconductor layer and a $Al_{X3}Ga_{1-X3}As$ second composition graded layer that are sequentially disposed on the first epitaxial structure in such order. A method for making the abovementioned multi-junction LED is also disclosed.

21 Claims, 8 Drawing Sheets

MULTI-JUNCTION LIGHT-EMITTING DIODE AND METHOD FOR MAKING THE SAME

CROSS-REFERENCE TO RELATED APPLICATION

This application is a bypass continuation-in-part (CIP) application of PCT International Application No. PCT/CN2020/075867, filed on Feb. 19, 2020. The entire content of the international patent application is incorporated herein by reference.

FIELD

The disclosure relates to a multi-junction light-emitting diode, and a method for making the same.

BACKGROUND

An infrared light-emitting diode (LED) is configured to emit infrared light, and is applied in various fields, in particular gas detection, as well as security controls, wearable devices, communication systems, remote control devices, light sources for sensors, night lightings, etc. Since infrared LEDs applied in security controls and night lightings are required to have a relatively high brightness, a multi-junction LED which includes multiple epitaxial structures connected in series with each other through tunnel junction(s) during epitaxial growth, is used to achieve a high peak tunnel current density. In order to achieve such peak tunnel current density, materials for making the tunnel junction(s), sources of dopant(s), doping concentration and epitaxial growth process should be taken into consideration.

It is noted that infrared LEDs are mainly made of AlGaAs-based materials or GaAs-based materials, which undesirably absorb light, and have a relatively large series resistance. In order to achieve a high efficiency, a low light absorption and a low voltage, the tunnel junction should meet the following requirements: (1) a p-region and an n-region thereof should be as thin as possible (e.g., less than 15 nm), (2) the materials for making the p-region and the n-region should have a band gap (Eg) greater than that of the main peak wavelength (hv), (i.e., Eg>hv) so as to avoid light absorption, and (3) each of the p-region and the n-region should have a doping concentration greater than $1\times10^{19}$ cm$^{-3}$.

In practical application of the multi-junction LEDs, an increased demand of products having a large size and a high brightness (e.g., vehicle lamps, stage lighting, iris recognition devices) would lead to an increase in the injected current passing through such products, resulting in a higher requirement of the peak tunnel current density of the tunnel junction. Although adopting materials with a lower band gap might increase the peak tunnel current density of the multi-junction LEDs, such material might absorb light and adversely reduce brightness.

SUMMARY

Therefore, an object of the disclosure is to provide a multi-junction light-emitting diode and a method for making the multi-junction light-emitting diode that can alleviate at least one of the drawbacks of the prior art.

According to the disclosure, the multi-junction LED includes a first epitaxial structure, a second epitaxial structure, and a tunnel junction structure disposed between the first and second epitaxial structures. The tunnel junction structure includes a highly doped p-type semiconductor layer, a first composition graded layer, a highly doped n-type semiconductor layer and a second composition graded layer. The highly doped p-type semiconductor layer is made of a material represented by In$_z$Al$_{X1}$Ga$_{1-X1}$As, wherein z ranges from 0 to 0.05. The first composition graded layer is disposed on the highly doped p-type semiconductor layer, and is made of a material represented by Al$_{X2}$Ga$_{1-X2}$As, wherein X2 is greater than 0 and less than X1. The highly doped n-type semiconductor layer is disposed on the first composition graded layer opposite to the highly doped p-type semiconductor layer, and is made of a material represented by Ga$_y$In$_{1-y}$P. The second composition graded layer is disposed on the highly doped n-type semiconductor layer opposite to the first composition graded layer, and is made of a material represented by Al$_{X3}$Ga$_{1-X3}$As.

According to the disclosure, a method for making the multi-junction LED includes the steps of:

(A) forming a first epitaxial structure, (B) forming a tunnel junction structure on the first epitaxial structure, wherein the tunnel junction structure includes:

a highly doped p-type semiconductor layer that is made of a material represented by In$_z$Al$_{X1}$Ga$_{1-X1}$As, z ranging from 0 to 0.05;

a first composition graded layer that is disposed on the highly doped p-type semiconductor layer and that is made of a material represented by Al$_{X2}$Ga$_{1-X2}$As, X2 being greater than 0 and less than X1;

a highly doped n-type semiconductor layer that is disposed on the first composition graded layer opposite to the highly doped p-type semiconductor layer and that is made of a material represented by Ga$_y$In$_{1-y}$P; and a second composition graded layer that is disposed on the highly doped n-type semiconductor layer opposite to the first composition graded layer and that is made of a material represented by Al$_{X3}$Ga$_{1-X3}$As, and (C) forming a second epitaxial structure on the tunnel junction structure opposite to the first epitaxial structure.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
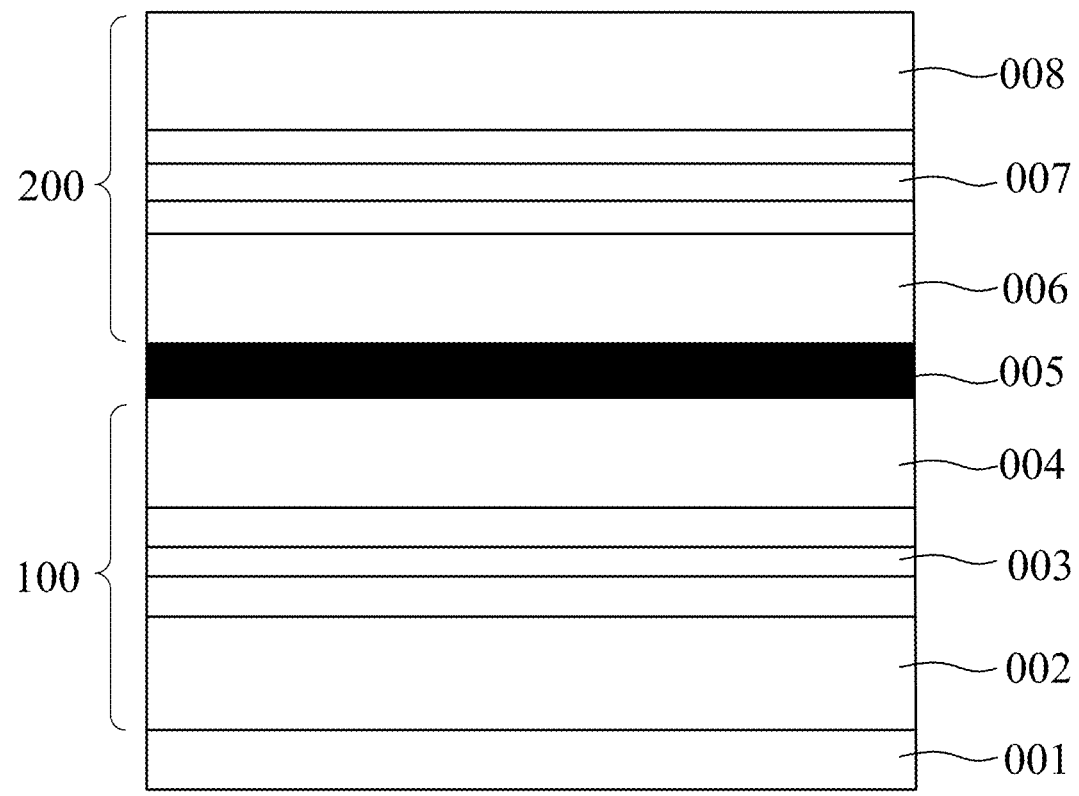
FIG. 1 is a schematic view illustrating an embodiment of a multi-junction LED according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a multi-junction light-emitting diode (LED) according to the disclosure includes a first epitaxial structure 100, a second epitaxial structure 200, and a tunnel junction structure 005 disposed between the first epitaxial structure 100 and the second epitaxial structure 200. A method for making the multi-junction LED according to the disclosure includes the following steps A to C.

Figure 3:
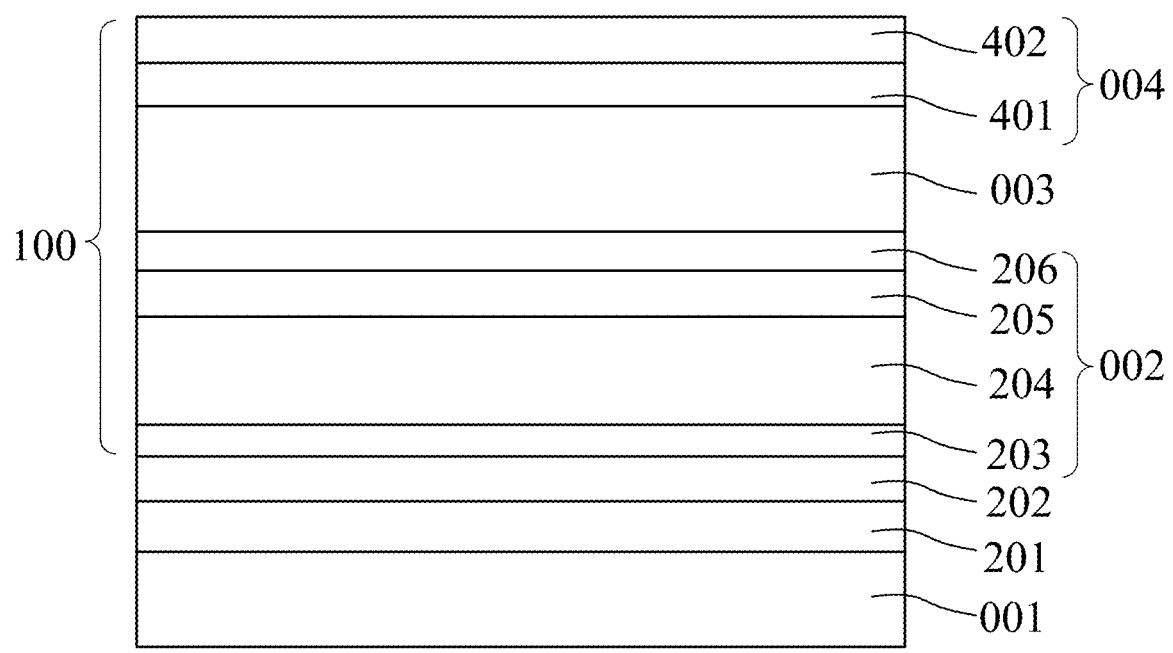
FIGS. 3 to 5 are schematic views illustrating steps A to C of a method for making the multi-junction LED according to the disclosure.

Referring to FIG. 3, in step A, the first epitaxial structure 100 is formed on a growth substrate 001. The growth substrate 001 may be made of an n-type GaAs material having a deviation angle of 2° from a crystal plane (100). The growth substrate 001 may have a thickness of approximately 350 μm and a diameter of 100 mm, and may be doped at a doping concentration ranging from $1\times10^{18}$ $cm^{-3}$ to $3\times10^{18}$ $cm^{-3}$.

The first epitaxial structure 100 includes a first n-type semiconductor layer 002, a first active layer 003 and a first p-type semiconductor layer 004 that are sequentially formed on the growth substrate 001 in such order. For epitaxial growth of these layers of the first epitaxial structure 100, a metal-organic chemical vapor deposition (MOCVD) process may be conducted, where Group III elements may be sourced from trimethylaluminum ($(CH_3)_3Al$), trimethylgallium ($(CH_3)_3Ga$) and trimethylindium ($(CH_3)_3In$), Group V elements may be sourced from $PH_3$ and $AsH_3$, and dopants may be sourced from carbon tetrabromide ($CBr_4$), diethyl tellurium ($Te(C_2H_5)_2$), disilane ($Si_2H_6$) and diethylzinc ($Zn(C_2H_5)_2$).

To reduce the lattice mismatch between the materials of the growth substrate 001 and the first epitaxial structure 100, and to improve quality of epitaxial growth of the first epitaxial structure 100, a buffer layer 201 may be first formed on the growth substrate 001. The buffer layer 201 may be made of GaAs, and may be doped with Si. The buffer layer 201 may have a thickness of approximately 0.3 μm.

To prevent the multi-junction LED from damage by subsequent processing (e.g., transferring the multi-junction LED from the growth substrate 001 to another substrate, followed by removal of the growth substrate 001 by etching process), an etch stop layer 202 is formed between the buffer layer 201 and the first epitaxial structure 100. The etch stop layer 202 may be made of GaInP, and may have a thickness of approximately 100 nm.

In this embodiment, the first n-type semiconductor layer 002 includes an n-type ohmic contact sublayer 203, an n-type window sublayer 204, a first n-type cladding sublayer 205 and a first lower undoped separate confinement sublayer 206 that are sequentially formed on the etch stop layer 202 in such order.

The n-type ohmic contact sublayer 203 may be made of GaAs, and may be doped with Si at a doping concentration greater than $1\times10^{18}$ $cm^{-3}$, such as greater than $2\times10^{18}$ $cm^{-3}$. The n-type ohmic contact sublayer 203 may have a thickness less than 200 nm, such as ranging from 30 nm to 100 nm.

The n-type window sublayer 204 may be made of AlGaAs, and may be doped with Te at a doping concentration of $1\times10^{18}$ $cm^{-3}$. The n-type window sublayer 204 may have a thickness ranging from about 4 μm to about 7 μm. The n-type window sublayer 204 may serve as a current spreading layer.

The first n-type cladding sublayer 205 may be made of AlGaAs, and may be doped with Te at a doping concentration ranging from $5\times10^{17}$ $cm^{-3}$ to $2\times10^{18}$ $cm^{-3}$. The first n-type cladding sublayer 205 may have a thickness of approximately 0.5 μm.

The first lower undoped separate confinement sublayer 206 may be made of AlGaAs, and may have a thickness ranging from 300 nm to 1 μm.

The first active layer 003 may emit a light having different wavelength ranging from 760 nm to 1100 nm. The first active layer 003 may have a multiple quantum well structure which may include 1 to 25 pairs (e.g., 3 to 12 pairs) of well layers and barrier layers that are alternately stacked. Each of the well layers may be made of InGaAs or InGaAsP, and may have a thickness ranging from 3 nm to 15 nm. Each of the barrier layers may be made of AlGaAs, AlGaAsP or GaAsP, and may have a thickness ranging from 5 nm to 50 nm. By adjusting the composition of the well and barrier layers, the first active layer 003 may emit light having various wavelength. In this embodiment, the first active layer 003 is configured to emit a light having a wavelength of 850 nm. The multiple quantum well structure of the first active layer 003 includes 10 pairs of the well layers and the barrier layers, in which each of the well layers is made of $In_{0.2}Ga_{0.8}As$, is undoped, and has a thickness of approximately 5.5 nm; and each of the barrier layers is made of $Al_{0.2}Ga_{0.8}As$, is undoped, and has a thickness of approximately 15 nm.

The first p-type semiconductor layer 004 may include a first upper undoped separate confinement sublayer 401 and a first p-type cladding sublayer 402 that are sequentially formed on the first active layer 003 in such order.

The first upper undoped separate confinement sublayer 401 may be made of AlGaAs, and may have a thickness ranging from 300 nm to 1 μm.

The first p-type cladding sublayer 402 may be made of AlGaAs, and may be doped with carbon at a doping concentration of $1\times10^{18}$ $cm^{-3}$. The first p-type cladding sublayer 402 may have a thickness ranging from about 0.3 μm to about 0.8 μm.

Figure 2:
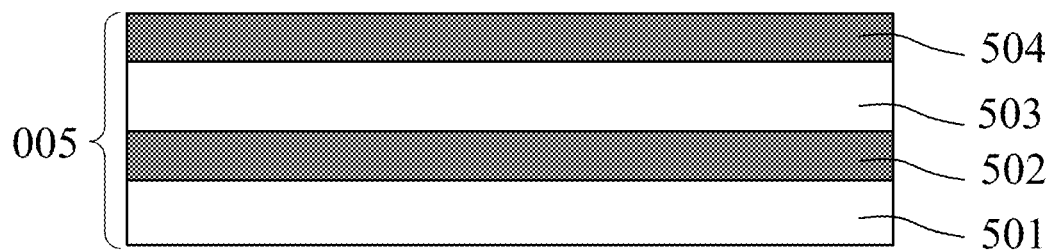
FIG. 2 is an enlarged schematic view illustrating a tunnel junction structure of the embodiment.
Figure 4:
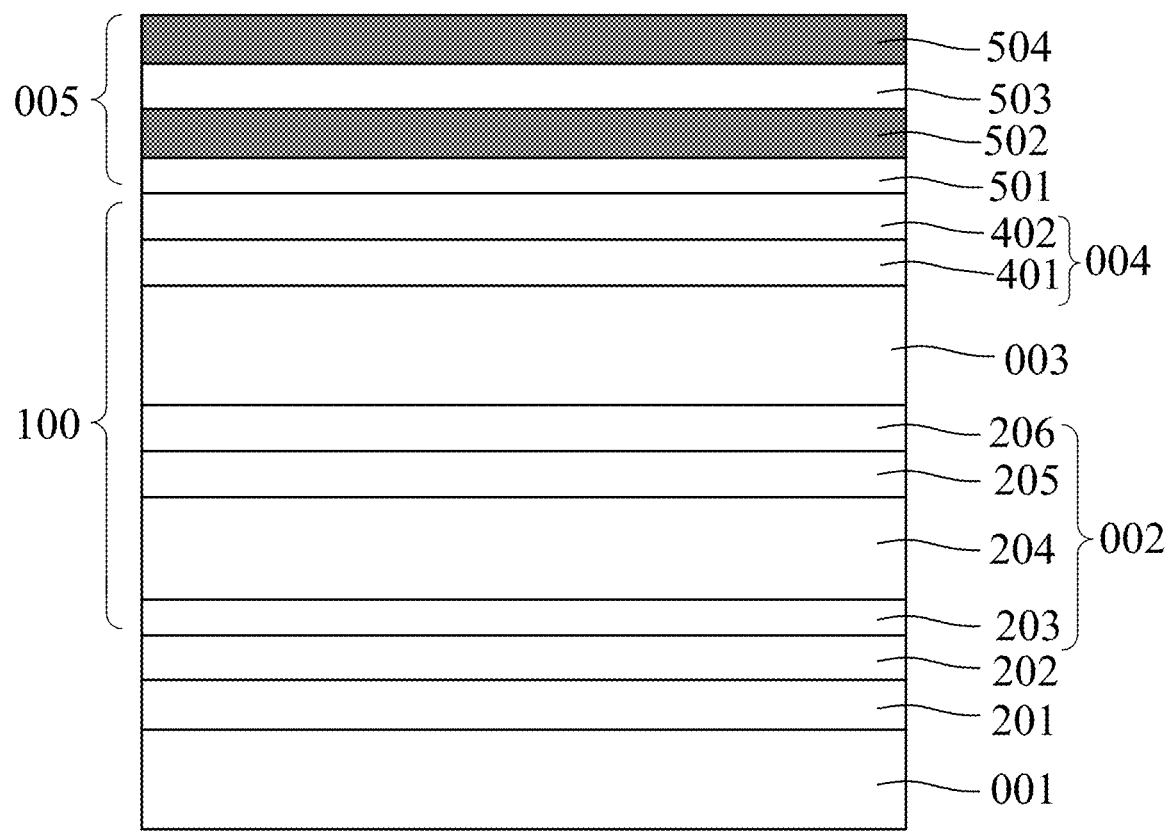

Referring to FIGS. 1, 2 and 4, in step B, the tunnel junction structure 005 is formed on the first epitaxial structure 100 opposite to the growth substrate 001. The tunnel junction structure 005 includes a highly doped p-type semiconductor layer 501, a first composition graded layer 502, a highly doped n-type semiconductor layer 503 and a second composition graded layer 504 that are sequentially formed on the first p-type semiconductor layer 004 in such order.

The highly doped p-type semiconductor layer 501 is made of a material represented by $In_zAl_{X1}Ga_{1-X1}As$, wherein z ranges from 0 to 0.05. In certain embodiments, X1 is greater than 0 and not greater than 0.8. The highly doped p-type semiconductor layer 501 may have a doping concentration not less than $1\times10^{19}$ $cm^{-3}$. In certain embodiments, the highly doped p-type semiconductor layer 501 may be doped with carbon at a concentration ranging from $1\times10^{19}$ $cm^{-3}$ to $2\times10^{20}$ $cm^{-3}$. The highly doped p-type semiconductor layer 501 may have a thickness ranging from 10 nm to 100 nm. In this embodiment, the highly doped p-type semiconductor layer 501 is made of $Al_{0.3}Ga_{0.7}As$ (i.e., Z=0, X1=0.3), is doped with carbon at a concentration of $8\times10^{19}$ $cm^{-3}$, and has a thickness of 50 nm.

The first composition graded layer 502 is made of a material represented by $Al_{X2}Ga_{1-X2}As$, wherein X2 is greater than 0 and less than X1. In the first composition graded layer 502, Al content (i.e., X2) gradually decreases in a direction from the highly doped p-type semiconductor layer 501 toward the highly doped n-type semiconductor layer 503. With such compositional design of the first composition graded layer 502, lattice defects caused by directly growing the highly doped n-type semiconductor layer 503 (GaInP) on the highly doped p-type semiconductor layer 501 (AlGaAs) may be significantly reduced, and the crystal quality of subsequent epitaxial growth may be improved, which in turn decreases series resistance and working voltage, and increases light-emitting efficiency of the multi-junction LED.

In certain embodiments, the first composition graded layer 502 is a p-type layer which is doped with carbon at a doping concentration ranging from $1\times10^{19}$ cm$^{-3}$ to $5\times10^{19}$ cm$^{-3}$. The first composition graded layer 502 may have a thickness ranging from 10 nm to nm. In this embodiment, the first composition graded layer 502 is doped with carbon at a doping concentration of $3\times10^{19}$ cm$^{-3}$, and has a thickness of 30 nm. In addition, X2 in $Al_{X2}Ga_{1-X2}As$ for making the first composition graded layer 502 linearly decreases in the direction from the highly doped p-type semiconductor layer 501 toward the highly doped n-type semiconductor layer 503.

The highly doped n-type semiconductor layer 503 is made of a material represented by $Ga_YIn_{1-Y}P$. In certain embodiments, Y ranges from 0.45 to 0.7. The highly doped n-type semiconductor layer 503 may have a doping concentration not less than $1\times10^{19}$ cm$^{-3}$. In certain embodiments, the highly doped n-type semiconductor layer 503 may be doped with tellurium at a doping concentration ranging from $1\times10^{19}$ cm$^{-3}$ to $2\times10^{20}$ cm$^{-3}$. The highly doped n-type semiconductor layer 503 may have a thickness ranging from 10 nm to 100 nm. As compared with conventionally used GaAs or AlGaAs, such highly doped n-type semiconductor layer 503 has a large band gap which is conducive for effectively combining multiple epitaxial structures together and also for reducing light absorption by the tunnel junction structure 005. In this embodiment, the highly doped n-type semiconductor layer 503 is made of $Ga_{0.6}In_{0.4}P$ (i.e., Y=0.6), has a thickness of nm, and is doped with tellurium at a doping concentration of $8\times10^{19}$ cm$^{-3}$.

In certain embodiments, the highly doped n-type semiconductor layer 503 is further doped with silicon at a doping concentration ranging from $5\times10^{18}$ cm$^{-3}$ to $2\times10^{19}$ cm$^{-3}$. The doping concentration of tellurium to the doping concentration of silicon may be in a ratio ranging from 5:3 to 2:1. By virtue of the doping concentration of tellurium being higher than the doping concentration of silicon, crystal quality of the highly doped n-type semiconductor layer 503, and the first epitaxial structure 100, the tunnel junction structure 005 and the second epitaxial structure 200 as well may be improved.

The second composition graded layer 504 is made of a material represented by $Al_{X3}Ga_{1-X3}As$. In the second composition graded layer 504, Al content (i.e., X3) gradually increases in a direction away from the highly doped n-type semiconductor layer 503. With such configuration, the lattice mismatch between the highly doped n-type semiconductor layer 503 and a second n-type cladding sublayer 601 (described hereinafter) of the second epitaxial structure 200 to be formed thereon may be greatly reduced, thereby reducing Ga-rich defects and Al-rich defects generated during formation of the second n-type cladding sublayer 601. As such, crystal quality of the second epitaxial structure 200 may be enhanced, thereby decreasing series resistance and working voltage, and increasing light-emitting efficiency of the multi-junction LED.

In certain embodiments, the second composition graded layer 504 is an n-type semiconductor layer which is doped with tellurium at a doping concentration ranging from $1\times10^{19}$ cm$^{-3}$ to $5\times10^{19}$ cm$^{-3}$. The second composition graded layer 504 may have a thickness ranging from 10 nm to 50 nm. In this embodiment, the second composition graded layer 504 is doped with tellurium at a doping concentration of $3\times10^{19}$ cm$^{-3}$ and has a thickness of 30 nm. In addition, X3 in $Al_{X3}Ga_{1-X3}As$ for making the second composition graded layer 504 linearly increases in the direction away from the highly doped n-type semiconductor layer 503.

Figure 5:
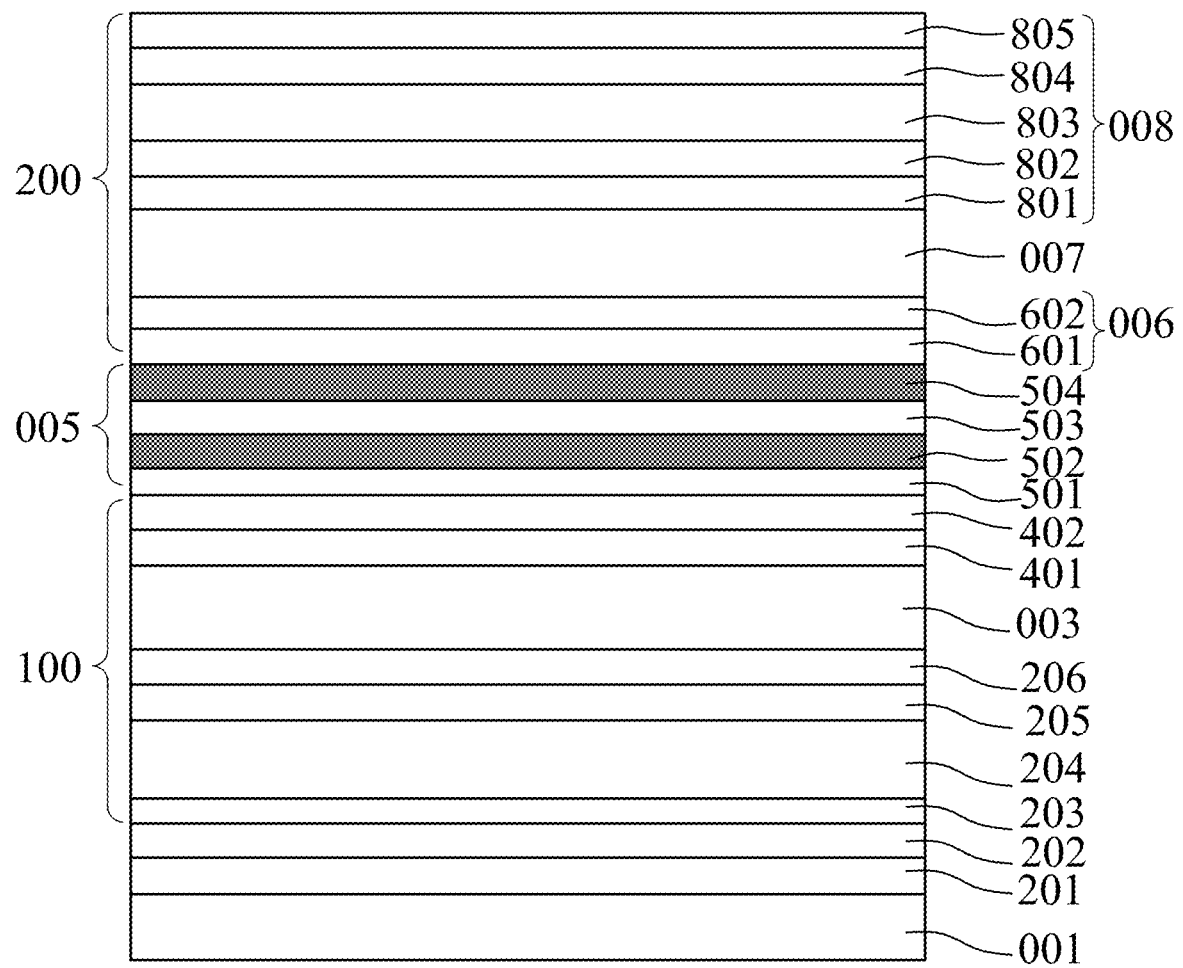

Referring to FIGS. 1 and 5, in step C, the second epitaxial structure 200 includes a second n-type semiconductor layer 006, a second active layer 007 and a second p-type semiconductor layer 008 that are sequentially formed on the tunnel junction structure 005 opposite to the first epitaxial structure 100.

The second n-type semiconductor layer 006 may include a second n-type cladding sublayer 601 and a second lower undoped separate confinement sublayer 602 that are sequentially formed on the second composition graded layer 504 in such order.

The second n-type cladding sublayer 601 may be made of AlGaAs, and may have a doping concentration ranging from $5\times10^{17}$ cm$^{-3}$ to $2\times10^{18}$ cm$^{-3}$, such as $1\times10^{18}$ cm$^{-3}$. The second n-type cladding sublayer 601 may have a thickness of approximately 0.5 μm.

The second lower undoped separate confinement sublayer 602 may be made of AlGaAs, and may have a thickness of 80 nm.

The second active layer 007 may have a multiple quantum well structure that includes 1 to 25 pairs of well layers and barrier layers that are alternately stacked. Each of the well layers may be made of InGaAs, and each of the barrier layers may be made of AlGaAs. By adjusting the compositions of the well layers and barrier layers, the second active layer 007 may emit infrared light having a wavelength ranging from 760 nm to 1100 nm. The second active layer 007 may have a total thickness ranging from 20 nm to 500 nm. In this embodiment, the second active layer 007 has a configuration the same as that of the first active layer 003.

The second p-type semiconductor layer 008 may include a second upper undoped separate confinement sublayer 801, a second p-type cladding sublayer 802, a p-type window sublayer 803, a p-type current blocking sublayer 804 and a p-type ohmic contact sublayer 805 that are sequentially formed on the second active layer 007 in such order.

The second upper undoped separate confinement sublayer 801 may be made of AlGaAs, and may have a thickness of 0.2 μm.

The second p-type cladding sublayer 802 may be made of AlGaAs, and may be doped with carbon at a doping concentration of $1.5\times10^{18}$ cm$^{-3}$. The second p-type cladding sublayer 802 may have a thickness of 0.4 μm.

The p-type window sublayer 803 may be made of AlGaAs, and may have a doping concentration ranging from $5\times10^{17}$ cm$^{-3}$ to $1\times10^{18}$ cm$^{-3}$. The p-type window sublayer 803 may have a thickness of 1 μm.

The p-type current blocking sublayer 804 may be made of GaInP, and may have a doping concentration ranging from $1\times10^{18}$ cm$^{-3}$ to $3\times10^{18}$ cm$^{-3}$. The p-type current blocking sublayer 804 may have a thickness approximately ranging from 10 nm to 30 nm.

The p-type ohmic contact sublayer 805 may be made of GaP, and may have a doping concentration of $6\times10^{19}$ cm$^{-3}$. The p-type ohmic contact sublayer 805 may have a thickness approximately ranging from 30 nm to 60 nm.

The multi-junction LED thus prepared may be further subjected to a die fabrication process, so as to obtain a multi-junction LED chip.

Figure 6:
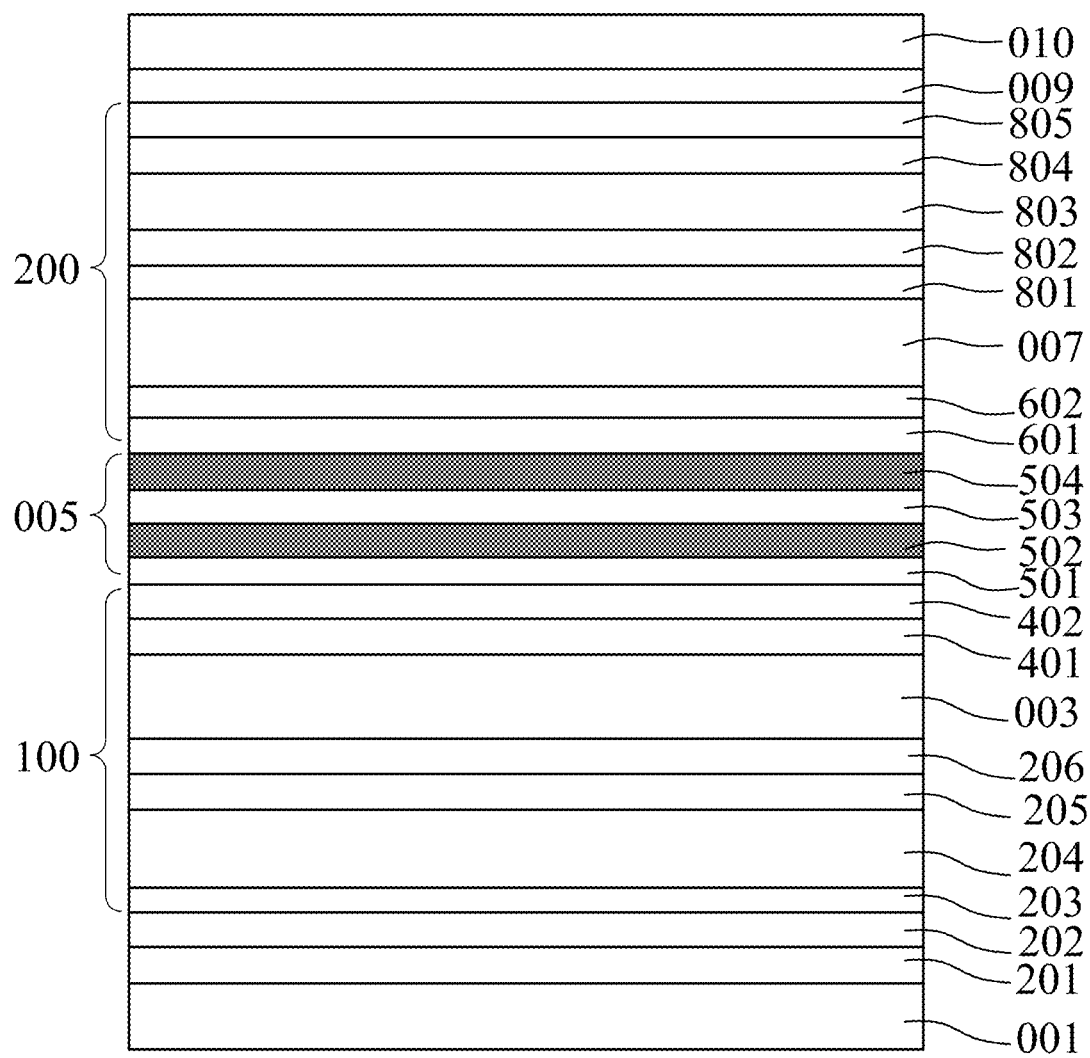
FIGS. 6 to 8 are schematic views illustrating the multi-junction LED according to the disclosure being subjected to the die fabrication process.

Specifically, referring to FIG. 6, a reflective layer 009 is formed on the p-type ohmic contact sublayer 805 opposite to the p-type current blocking sublayer 804. The resultant structure is bonded to a conductive substrate 010 through a bonding layer (not shown in figures).

Figure 7:
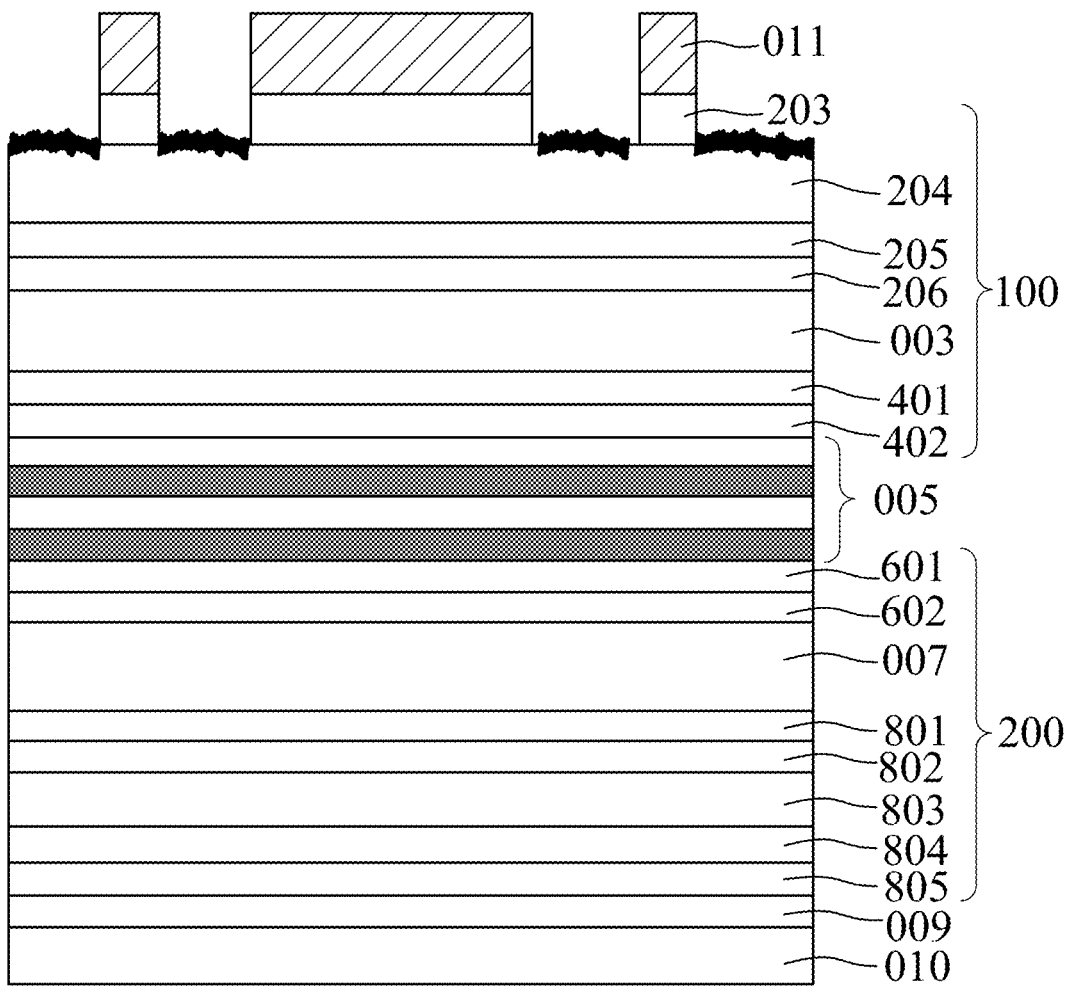

Then, referring to FIG. 7, an etching process is conducted to remove the growth substrate 001, the buffer layer 201 and the corrosion resisting layer 202, and to expose the n-type ohmic contact sublayer 203. A first electrode 011 is disposed on the n-type ohmic contact sublayer 203 to form ohmic contact therewith. After a patterned mask is disposed on the first electrode 011, an etching process is conducted to remove the n-type ohmic contact sublayer 203 not covered by the first electrode 011, and to expose the n-type window sublayer 204. The exposed n-type window sublayer 204 may then be etched to form a patterned surface or a roughened surface, which is conducive to increase the light extraction efficiency of the multi-junction LED chip.

Figure 8:
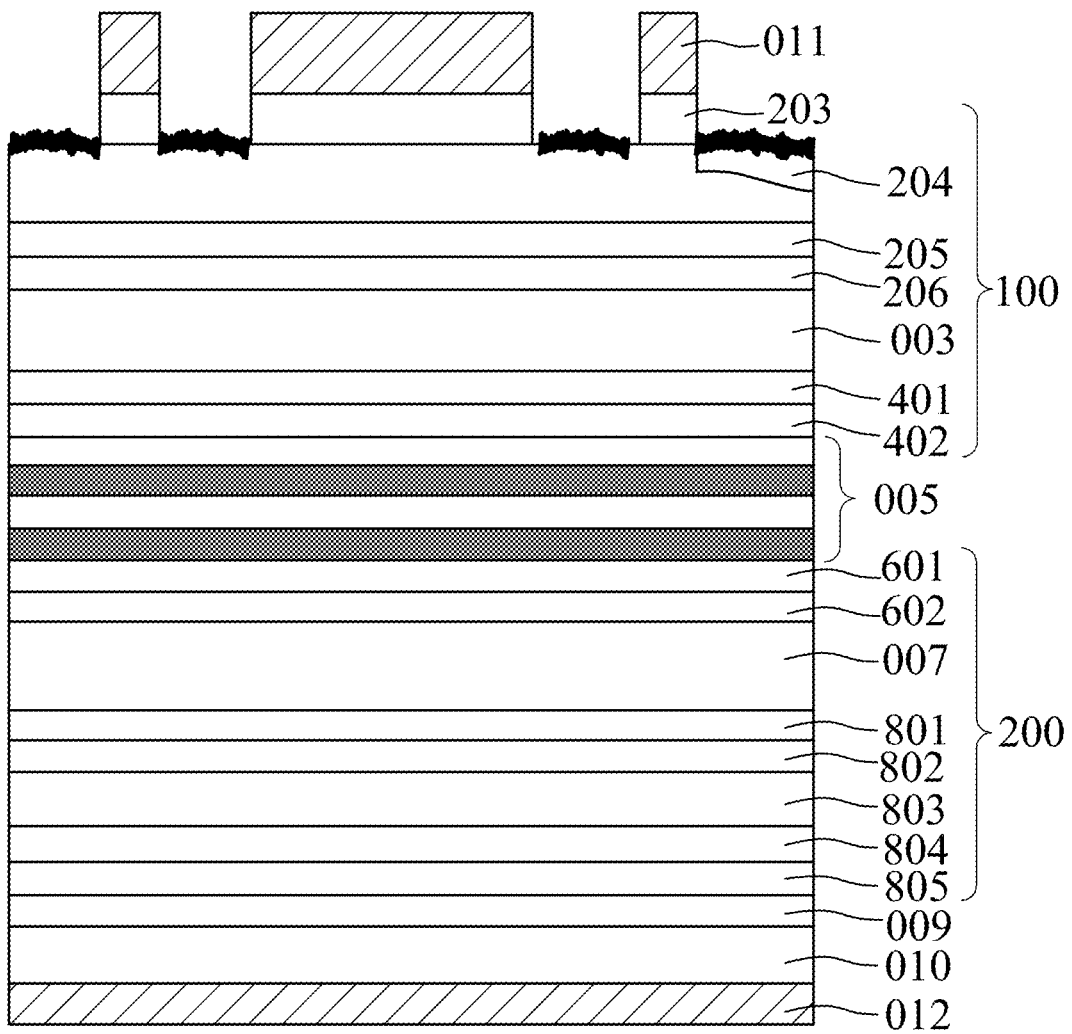

Referring to FIG. 8, a second electrode 012 is formed on the conductive substrate 010 opposite to the reflective layer 009, such that current can flow between the first electrode 011 and the second electrode 012 through the first epitaxial structure 100, the tunnel junction structure 005 and the second epitaxial structure 200.

The thus obtained multi-junction LED chip may be further subjected to, for instance, an etching process or a dicing process, so as to achieve one or more individual multi-junction LED element(s) each having a desired size.

An example of the multi-junction LED chip according to the disclosure (E1) is prepared as a 42 mil LED chip, wherein the highly doped n-type semiconductor layer 503 is made of a material represented by $Ga_YIn_{1-Y}P$ (where $Y=0.5$). A comparative multi-junction LED chip (CE1) is prepared in a similar manner as E1, except that the highly doped n-type semiconductor layer 503 is made of a material represented by AlGaAs. Both E1 and CE1 are subjected to a property test under a testing current of 350 mA so as to determine forward voltage ($V_f$) and brightness thereof. The results show that forward voltage ($V_f$) of E1 is 0.43 V lower than that of CE1, and the brightness of E1 is 7.5% higher than that of CE1. This indicates that as compared with AlGaAs or GaAs, the multi-junction LED of this disclosure having the highly doped n-type semiconductor layer 503 made of $Ga_YIn_{1-Y}P$ may effectively reduce undesired infrared light absorption by the tunnel junction structure 005, resulting in improved brightness of light emitted by the multi-junction LED.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A multi-junction light-emitting diode (LED), comprising a first epitaxial structure, a second epitaxial structure, and a tunnel junction structure disposed between said first epitaxial structure and said second epitaxial structure, said tunnel junction structure including:
    a highly doped p-type semiconductor layer that is made of a material represented by $In_zAl_{X1}Ga_{1-X1}As$, z ranging from 0 to 0.05;
    a first composition graded layer that is disposed on said highly doped p-type semiconductor layer and that is made of a material represented by $Al_{X2}Ga_{1-X2}As$, X2 being greater than 0 and less than X1;
    a highly doped n-type semiconductor layer that is disposed on said first composition graded layer opposite to said highly doped p-type semiconductor layer and that is made of a material represented by $Ga_YIn_{1-Y}P$; and
    a second composition graded layer that is disposed on said highly doped n-type semiconductor layer opposite to said first composition graded layer and that is made of a material represented by $Al_{X3}Ga_{1-X3}As$.

2. The multi-junction LED of claim 1, wherein in said highly doped p-type semiconductor layer, X1 is greater than 0 and not greater than 0.8.

3. The multi-junction LED of claim 1, wherein said highly doped p-type semiconductor layer has a doping concentration not less than $1 \times 10^{19}$ cm$^{-3}$.

4. The multi-junction LED of claim 1, wherein said highly doped p-type semiconductor layer is doped with carbon at a doping concentration ranging from $1 \times 10^{19}$ cm$^{-3}$ to $2 \times 10^{20}$ cm$^{-3}$.

5. The multi-junction LED of claim 1, wherein said highly doped p-type semiconductor layer has a thickness ranging from 10 nm to 100 nm.

6. The multi-junction LED of claim 1, wherein in said highly doped n-type semiconductor layer, Y ranges from 0.45 to 0.7.

7. The multi-junction LED of claim 1, wherein said highly doped n-type semiconductor layer has a doping concentration not less than $1 \times 10^{19}$ cm$^{-3}$.

8. The multi-junction LED of claim 1, wherein said highly doped n-type semiconductor layer is doped with tellurium at a doping concentration ranging from $1 \times 10^{19}$ cm$^{-3}$ to $2 \times 10^{20}$ cm$^{-3}$.

9. The multi-junction LED of claim 8, wherein said highly doped n-type semiconductor layer is further doped with silicon at a doping concentration ranging from $5 \times 10^{18}$ cm$^{-3}$ to $2 \times 10^{19}$ cm$^{-3}$.

10. The multi-junction LED of claim 9, wherein in said highly doped n-type semiconductor layer, the doping concentration of tellurium to the doping concentration of silicon is in a ratio ranging from 5:3 to 2:1.

11. The multi-junction LED of claim 1, wherein said highly doped n-type semiconductor layer has a thickness ranging from 10 nm to 100 nm.

12. The multi-junction LED of claim 1, wherein in said first composition graded layer, X2 gradually decreases in a direction from said highly doped p-type semiconductor layer toward said highly doped n-type semiconductor layer.

13. The multi-junction LED of claim 12, wherein X2 linearly decreases in a direction from said highly doped p-type semiconductor layer toward said highly doped n-type semiconductor layer.

14. The multi-junction LED of claim 1, wherein said first composition graded layer is a p-type semiconductor layer which is doped with carbon at a doping concentration ranging from $1\times10^{19}$ cm$^{-3}$ to $5\times10^{19}$ cm$^{-3}$.

15. The multi-junction LED of claim 1, wherein said first composition graded layer has a thickness ranging from 10 nm to 50 nm.

16. The multi-junction LED of claim 1, wherein in said second composition graded layer, X3 gradually increases in a direction away from said highly doped n-type semiconductor layer.

17. The multi-junction LED of claim 16, wherein X3 linearly increases in a direction away from said highly doped n-type semiconductor layer.

18. The multi-junction LED of claim 1, wherein said second composition graded layer is an n-type semiconductor layer which is doped with tellurium at a doping concentration ranging from $1\times10^{19}$ cm$^{-3}$ to $5\times10^{19}$ cm$^{-3}$.

19. The multi-junction LED of claim 1, wherein said second composition graded layer has a thickness ranging from 10 nm to 50 nm.

20. The multi-junction LED of claim 1, wherein each of said first and second epitaxial structures independently emits an infrared light having a wavelength ranging from 760 nm to 1100 nm.

21. A method for making a multi-junction LED, comprising the steps of:

(A) forming a first epitaxial structure, (B) forming a tunnel junction structure on the first epitaxial structure, wherein the tunnel junction structure includes:

a highly doped p-type semiconductor layer that is made of a material represented by $In_zAl_{X1}Ga_{1-X1}As$, z ranging from 0 to 0.05;

a first composition graded layer that is disposed on the highly doped p-type semiconductor layer and that is made of a material represented by $Al_{X2}Ga_{1-X2}As$, X2 being greater than 0 and less than X1;

a highly doped n-type semiconductor layer that is disposed on the first composition graded layer opposite to the highly doped p-type semiconductor layer and that is made of a material represented by $Ga_yIn_{1-y}P$; and a second composition graded layer that is disposed on the highly doped n-type semiconductor layer opposite to the first composition graded layer and that is made of a material represented by $Al_{X3}Ga_{1-X3}As$, and (C) forming a second epitaxial structure on the tunnel junction structure opposite to the first epitaxial structure.

* * * * *